United States Patent
Kahlman et al.

(10) Patent No.: US 6,252,734 B1
(45) Date of Patent: Jun. 26, 2001

(54) ARRANGEMENT FOR REPRODUCING A DIGITAL SIGNAL FROM A TRACK ON A MAGNETIC RECORD CARRIER HAVING AN EQUALIZER FILTER IN THE FORM OF A TRANSCONDUCTANCE-CAPACITOR FILTER

(75) Inventors: Josephus A. H. M. Kahlman; Albert M. A. Rijckaert, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/526,798

(22) Filed: Oct. 13, 1994

Related U.S. Application Data

(63) Continuation of application No. 07/957,574, filed on Oct. 7, 1992, now abandoned.

(30) Foreign Application Priority Data

Dec. 18, 1991 (EP) .................................................. 91203350

(51) Int. Cl.$^7$ .................................................. G11B 5/035
(52) U.S. Cl. .............................................................. 360/65
(58) Field of Search ................................ 360/46, 65, 67; 333/18, 28 R; 330/304, 305

(56) References Cited

U.S. PATENT DOCUMENTS

| | | | |
|---|---|---|---|
| 4,479,152 | * 10/1984 | Chi | 360/65 |
| 4,564,869 | * 1/1986 | Baumeister | 360/65 |
| 4,722,010 | * 1/1988 | Suzuki et al. | 360/65 |
| 4,736,257 | * 4/1988 | Watanabe et al. | 360/65 |
| 4,945,311 | * 7/1990 | Smith | 328/167 |
| 5,237,588 | 8/1993 | Tanaka et al. | 375/11 |
| 5,274,512 | 12/1993 | Tanaka et al. | 360/65 |

FOREIGN PATENT DOCUMENTS 0387813   9/1990  (EP) .

OTHER PUBLICATIONS

IEEE Journal of Solid–State Circuits, vol. 23, No. 3, Jun. 1988, pp. 750–758. A 4–MHz CMOS Continuous–Time Filter with On–Chip Automatic Tuning. Krummenacher et al.

IEEE Journal of Solid–State Circuits, vol. 23, No. 4, Aug. 1988, pp. 987–996. Design of a 4–MHz Analog Integrated CMOS Transconductance–C Bandpass Filter. Park et al.

IEEE Journal of Solid–State Circuits, vol. 24, No. 3, Jun. 1989, pp. 736–743. A Micropower CMOS Continuous— Time Low Pass Filter. Kaiser.

(List continued on next page.)

Primary Examiner—W. Chris Kim
(74) Attorney, Agent, or Firm—Edward W. Goodman

(57) ABSTRACT

An arrangement for reproducing an electric signal from a track on a magnetic record carrier (2) includes a magnetic read head (1) for reading from the track an electric signal and for supplying the electric signal to an output, and automatic equalizer filter (5), including transconductance-capacitor filter (6). The transc-filter (6) has a tuning signal input (8). The equalizer filter (5) has a control signal input (15) and is adapted to automatically equalize the electric signal read from the track in response to a control signal supplied to its control signal input, and to supply an equalized output signal at its output (12). The tuning signal input of the transc-filter is coupled to the control signal input of the equalizer filter. The arrangement further includes a control signal generator (13,16) having an output (16) coupled to the control signal input (15) of the equalizer filter (5), the generator being adapted to generate a control signal and to supply the control signal to its output (16). The transconductance-capacitor filter (6) has a magnitude filter characteristic which increases with increasing frequencies in a frequency range below a reference frequency of the filter. The transconductance-capacitor filter is adapted to control the reference frequency in the filter characteristic in response to the control signal, so as to vary the angle of inclination of the filter curve below the reference frequency.

10 Claims, 2 Drawing Sheets

OTHER PUBLICATIONS

IEEE Journal of Solid–State Circuits, vol. 136, Pt. G, No. 4, Aug. 1989, pp. 184–190. Design of Continuous—Time Fully Integrated Filters: A Review. Schuumann.

IEEE Int. Solid–State Circuits Conference, Paper TP 8.2, pp. 134, 135 and 303. 1991. A 15 MHz CMOS Continuous—Time Bessel Filter for Disk Drives. Khoury.

* cited by examiner

ARRANGEMENT FOR REPRODUCING A DIGITAL SIGNAL FROM A TRACK ON A MAGNETIC RECORD CARRIER HAVING AN EQUALIZER FILTER IN THE FORM OF A TRANSCONDUCTANCE-CAPACITOR FILTER

This is a continuation of application Ser. No. 07/957,574, filed on Oct. 7, 1992 abandoned.

BACKGROUND OF THE INVENTION

1. Field of the Invention

The invention relates to an arrangement for reproducing an electric signal from a track on a magnetic record carrier, the arrangement including a magnetic read head for reading from the track an electric signal and for supplying the electric signal to an output, variable equalizer filter means, having an input coupled to an output of the magnetic read head, a control signal input and an output, the equalizer filter means being adapted to equalize the electric signal read from the track in response to a control signal supplied to its control signal input, and to supply an equalized output signal at its output, and control signal generator means having an output coupled to the control signal input of the equalizer filter means, the generator means being adapted to generate a control signal and to supply the control signal to its output.

2. Description of the Related Art

Such an arrangement is known from published European Patent Application EP 387,813 A2, corresponding to U.S. Pat. Nos. 5,237,588 and 5,274,512.

In the known arrangement, equalization is realized by varying the filter parameters in response to the control signal supplied to the control signal input, such that the magnitude of the filter response is increased or decreased.

The generation of the control signal in the control signal generator means can be realized in various ways. In the known arrangement, the signal from the equalizer filter means is applied in digital form to a data processing circuit which includes a detection circuit. The detection circuit is adapted to detect the bit error rate in the signal applied to the data processing circuit. A control signal is generated in response to the error rate, which control signal is applied to the control signal input of the equalizer filter means, so as to vary the filter parameters such that the bit error rate is minimized.

The known arrangement has the disadvantage that rather complex circuitry is needed to realize the equalizer filter means and the control signal generator means. The reason is that the known arrangement makes use of equalizer filter means in digital form, so that generating the parameters for the filter in response to the error rate detected requires a complex algorithm.

SUMMARY OF THE INVENTION

The invention has for its object to provide an arrangement for reproducing a digital signal from a track on a magnetic record carrier with simpler circuitry for the realization of the equalizing function. To that purpose, the arrangement according to the invention is characterized in that the equalizer filter means comprise transconductance-capacitor filter means having a tuning signal input for receiving a tuning signal, the transconductance-capacitor filter means having a magnitude characteristic which increases as a function of increasing frequencies in a frequency range below a reference frequency, the control signal input of the the equalizer filter means being coupled to the tuning signal input of the transconductance-capacitor filter means, the transconductance-capacitor filter means further being adapted to control the reference frequency in the filter characteristic in response to the control signal, so as to vary the angle of inclination of the filter curve below the reference frequency.

The invention is based on the following recognition. Investigations have shown that the recording channel exhibits an increased loss towards higher frequencies, which loss occurs, among others, as a result of the properties of the tape that is used, and the quality of the tape-head contact. This loss must be compensated for by the equalizer filter means in order to enable optimal signal reception during reproduction. Transconductance-capacitor filter have appeared to be very useful for that purpose.

Transconductance-capacitor filters are filters of the continuous-time type, and are well known in the art. Reference is made in this respect to a number of publications in the IEEE Journal of solid-state circuits, Vol. 23, no. 3, June 1988, pp. 750–758, no. 4, August 1988, pp. 987–996, Vol. 24, no. 3, pp. 736–743, and the article "Design of continuous-time fully integrated filters: a review", by R. Schaumann, IEE Proceedings, Vol. 136, Pt.G, no. 4, August 1989, pp. 184–190. Transconductance-capacitor filters (called transc-filters) can be used to implement on-chip analog filters. The time constant of filter sections realized with the transc technique depend strongly on the IC-process-parameters. A variation up to 30% in the time constant is normal. Therefore, these filters must be tuned to the right frequency, which is also called 'tracking'. This is realized by giving each filter section a tuning control input to which a tuning control signal can be applied. By means of this tuning control signal, the time constant of the filter can be controlled to a required value which is fixed.

In most applications this is a disadvantage, because the filter requires special tracking circuitry.

In the application of the transc-filter in the equalizer filter means, a deliberate use has been made of the variability of the time constant in the transc-filter. In order to compensate for the high frequency loss, the filter should have a filter characteristic which is the inverse of said loss. The filter characteristic therefore exhibits a magnitude characteristic as a function of frequency which increases towards higher frequencies. Preferably, the magnitude characteristic exhibits an exponential behavior. This means that the magnitude of the filter characteristic, expressed in dB, as a function of frequency, plotted on a linear scale, is a more or less straight line with a positive angle for frequencies below the reference frequency. By applying the control signal to the tuning control signal input of the transc-filter, it is possible to vary the time constant and thus the reference frequency of the filter. This results in a sliding of the frequency scale on which the filter characteristic is plotted. As a consequence, this results in a variation of the angle of the more or less straight line, so that an automatic equalization can be realized.

The aforementioned tracking, for stabilizing the filter characteristic to a fixed form, can be realized in various ways. One way is to apply a certain reference voltage to the tuning signal input.

It should be noted that the use of a transc-filter in magnetic disk-drive reproduction channels has been described in the Digest of technical papers for the 1991 IEEE Int. Solid-state circuits conference, paper TP 8.2, pp.

134, 135 and 303. The filter realized is however a fixed low-pass filter for bandlimiting the noise at the output of the magnetic read head amplifier.

BRIEF DESCRIPTION OF THE DRAWINGS

These and other aspects of the invention will be apparent from, and further explained with reference to the embodiment described in, the following figure description, in which:

FIG. 1 discloses an embodiment of the reproducing arrangement comprising a magnetic read head 1 for reading information from a track on a magnetic record carrier 2. The output 3 of the read head 1 is coupled to an input 4 of equalizer filter means 5. The equalizer filter means 5 comprise a transconductance-capacitor filter 6, with an input 7 coupled to the input 4 of the equalizer filter means 5, a tuning signal input 8 and an output 9. The equalizer filter means 5 further comprise a sine-roll off filter 10, a cosine filter 11 having a zero crossing at the Nyquist frequency, and a phase corrector 17. With this arrangement it is possible to realize a partial response class IV detection. It should however be noted that the invention is also applicable to other detection systems, such as a Nyquist I detection or a full response detection.

Figure 1:
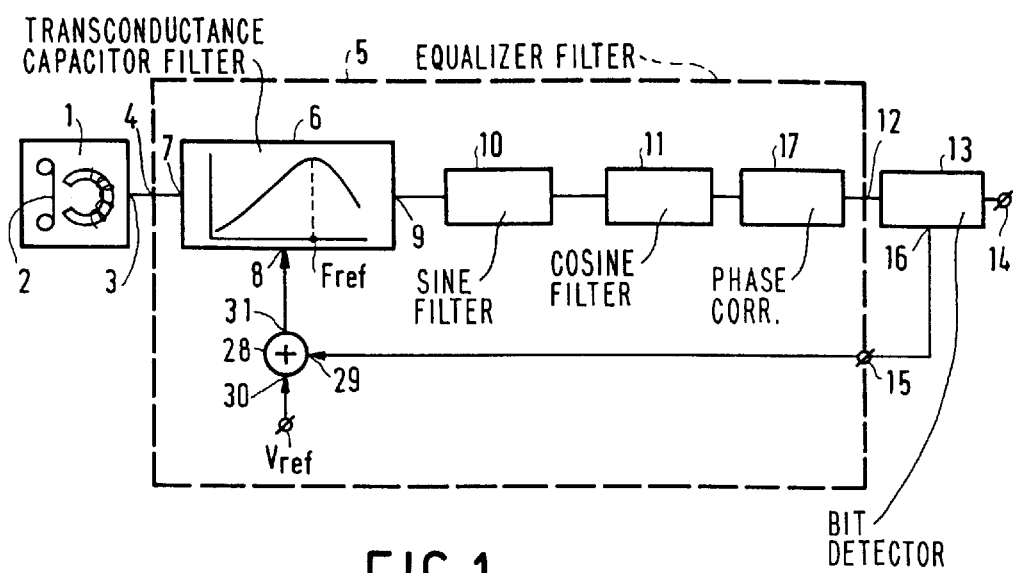
FIG. 1 shows an embodiment of the reproducing arrangement.

The output 12 of the equalizer filter 5 is coupled to a bit detector 13, which has an output coupled to an output 14 of the arrangement. The bit detector 13 realizes a bit detection on the equalized analog signal from the equalizer filter 5. This can be realized by means of sampling the output signal of the equalizer filter 5 by means of an A/D converter included in the bit detector 13, followed by a detection by means of for example a Viterbi detector. The sample rate for the A/D converter can be extracted from the signal itself. The reproduced digital signal will be available on the output 14 of the detector 13.

The equalizer filter 5 has a control signal input 15, to which an equalizer control signal can be applied. To that purpose, the arrangement has a control signal generator, which is in the present case included in the bit detector 13. The control signal generated will be available at the output 16. The control signal generated can be derived from the bit error rate present in the signal applied to the input of the bit detector 13, in the way as disclosed in European application no. 387,813 A2. However, other algorithms for deriving the control signal are equally well possible.

The equalizer filter 5 equalizes the signal applied to its input 4, in response to the control signal applied to the input 15, so as to obtain an equalized output signal at the output 12. The control signal input 15 is coupled to a first input 29 of a signal combination unit 28, which has an output 31 coupled to the tuning signal input 8 of the transc-filter 6. Further a reference voltage $V_{ref}$ is applied to a second input 30 of the combination unit 28. As has been explained previously, this voltage $V_{ref}$ is used in prior art transc-filters to compensate for variations in the values of the components from which the transc-filter is built up in the chip manufacturing process.

If a certain filter characteristic should be realized by means of a transc-filter, the transc-filter is designed to have capacitances with certain capacitor values. Because of the manufacturing process, a large spreading occurs in the capacitor values of the capacitances obtained, leading to a different filter characterictic than required. The voltage $V_{ref}$ influences the capacitor values of the capacitances in the chip, and thus the capacitor values of the capacitances of the transc-filter. This results in a sliding of the frequency scale, such that the required filter characteristic is obtained. By varying the voltage $V_{ref}$, this voltage can be set to such a fixed value that the required filter characteristic is obtained.

The transc-filter 6 has a magnitude characteristic as a function of frequency which increases with increasing frequency in a frequency range below a certain reference frequency $f_{ref}$. $f_{ref}$ is in the present case the frequency of the maximum in the filter characteristic. More specifically, the filter 6 has a magnitude characteristic of exponential character in this frequency range. This means that the following relation exists for the magnitude of the frequency characteristic H(f) as a function of frequency:

$$|H(f)|=A \exp(C.f/f_{ref})$$

where A and C are constants. $f_{ref}$ is an inherent parameter of the transc-filter 6 and is related to the time constant τ of the filter by the following relation:

$$\tau = C/f_{ref}$$

The reference voltage $V_{ref}$ is chosen such that the reference frequency $f_{ref}$ has a certain fixed value.

When plotting the magnitude |H(f)| in dB as a function of the frequency on a linear scale, using the formula given above, it will become clear that the frequency characteristic of the filter is a straight line, where the inclination angle α of the straight line has the following relation to $f_{ref}$:

$$\alpha \div C/f_{ref} = \tau.$$

Figure 2:
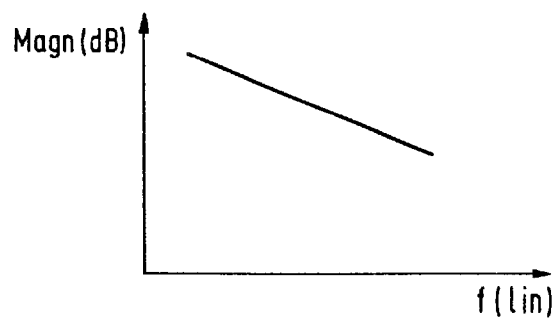
FIG. 2 shows the exponential roll-off of the magnetic recording channel.

FIG. 2 shows the magnitude of the transmission characteristic of the recording channel, expressed in dB, plotted on a linear frequency scale. The curve shows the flux of the signal recorded in a track on the record carrier, as a function of frequency. This curve should exhibit a horizontal line. However, in practice, the curve descends for increasing frequencies.

As can be seen from FIG. 2, an HF loss occurs due to the head-tape distance and other effects, such as the quality of the tape. This results in a more or less straight line that descends for increasing frequencies.

The compensation for this descending straight line can be realized by the transc-filter 6, which has a transmission curve which ascends as a function of frequency. This results in an equalized output signal at the output 12 of the equalizer filter 5. When correctly compensated for, the signal applied to the bit detector 13 has such a quality that the bit error rate is minimal.

A practical problem is that the degree of HF loss is not always the same, but depends on the quality of the reproducing heads and the tapes that are used, and of the quality of the tape-head contact. This results in more or less straight lines of different declination angle in the frequency diagram of FIG. 2. Assuming the transc-filter 6 has a fixed transmission characteristic, this leads to an increase of the bit error rate in the signal detected in the bit detector 13. The compensation for this HF loss should thus be made variable, and can be realized by means of the exponential transc-filter 6. By applying the equalizer control signal present at the input 15 to the input 8 of the transc-filter 6, via the combination unit 28, a sliding frequency axis can be obtained, as explained above. Otherwise said: the reference frequency $f_{ref}$ can be controlled so as to have different values in response to the control signal.

Figure 3:
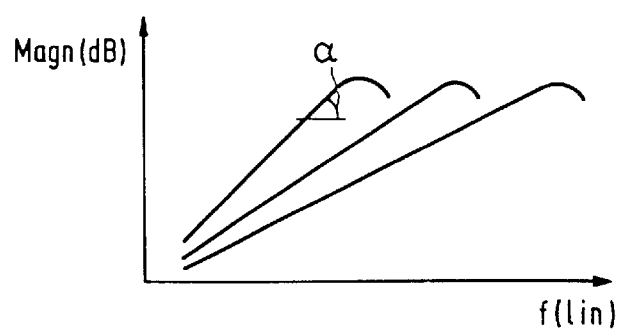
FIG. 3 shows various equalizer filter characteristics for different control signals applied to the tracking input of the transc-filter.

This results in different curves having different inclination angles α, as can be seen in FIG. 3, which show a number of filter characteristics of the transc-filter 6, for a number of values for $f_{ref}$. As can be seen from the above formula for α, an increase in $f_{ref}$ leads to a decrease in the inclination angle α.

An increase in bit error rate can mean that the inclination angle should be increased, or can mean that the inclination angle should be decreased. In order to realize a control of the inclination angle in a correct direction in response to an increase in bit error rate, the control can be such that upon an increase of the bit error rate the inclination angle is increased. If such increase of the inclination angle leads to a further increase of the bit error rate, this means that the inclination angle should have been decreased.

Another way of determining the direction of control in response to an increase in bit error rate, is to add a wobble signal to the control signal applied to the control signal input 15. By detecting the variation in bit error rate in response to the wobble signal, the correct direction of control can be determined.

It should be noted here that the equalization described above is the equalization as regards the magnitude of the signal to be equalized. In general, the equalizer filter means 5 is also capable of carrying out an equalization as regards the phase as a function of frequency. To that purpose, the equalizer filter means 5 can have a second control signal input (not shown), for receiving a second control signal. This second control signal input is coupled to a control signal input (not shown) of the phase corrector 17. The phase corrector 17 will then be capable of correcting the phase of the signal applied to its input as a function of frequency, in response to said second control signal.

Figure 4:
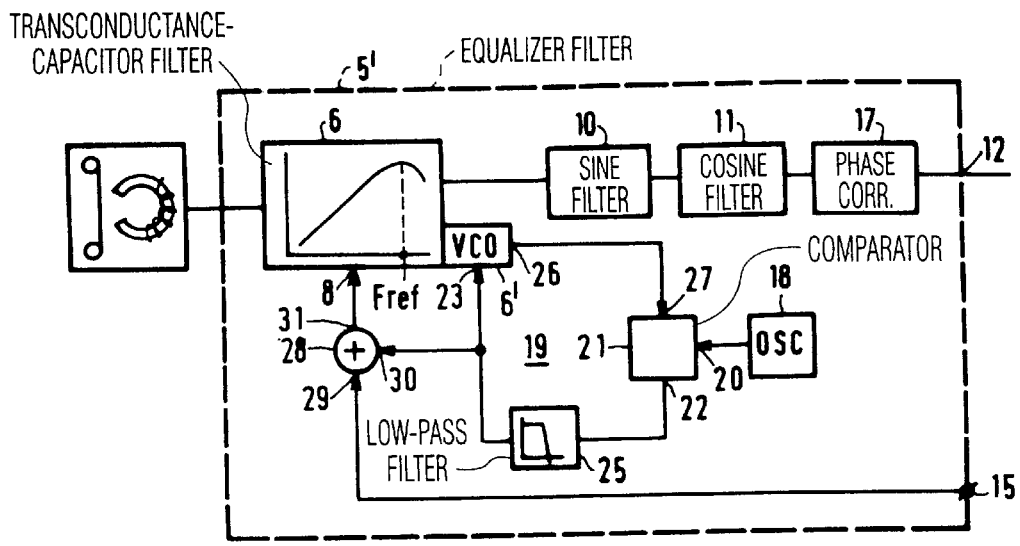
FIG. 4 shows a second embodiment of the reproducing arrangement.

FIG. 4 shows another embodiment of the arrangement, in which the equalizer filter 5' is of a different construction. In this embodiment, a voltage controlled oscillator 6' is incorporated on the same chip that comprises the transc-filter 6. An output 26 of the VCO 6' is coupled to a first input 27 of a comparator 21, a second input 20 of which is coupled to an output of an oscillator 18. An output 22 of the comparator 21 is coupled via a loop filter 25, which is in the form of a low-pass filter, to a control input 23 of the VCO 6', as well as to the input 30 of the signal combination unit 28. The comparator 21 can be in the form of a phase comparator or a frequency comparator. The function of the loop 19, comprising the VCO 6', the comparator 21, the oscillator 18 and the loopfilter 25, is to generate the reference voltage $V_{ref}$ such that the VCO oscillator frequency equals the frequency of the oscillator 18.

As the transc-filter 6 and the VCO 6' are realized on the same chip in a manufacturing step, the spreading in the component values is the same for all capacitances included in the transc-filter 6 and the VCO 6'. $V_{ref}$ is now applied to the VCO 6' as well. $V_{ref}$ thus influences the capacitor values of the capacitances in the VCO 6' and thus the oscillation frequency of the VCO 6' as well. The spreading in the capacitor values of the capacitances in the VCO 6', due to the manufacturing process, lead to a VCO oscillator frequency which is different from the oscillator frequency expected. The oscillator frequency present at the output 26 of VCO 6' is thus a measure of the spreading in the component values of the capacitances in the VCO 6' as well as the transc-filter 6. By comparing this frequency with a fixed oscillator frequency generated by the oscillator 18, in the comparator 21, the reference voltage $V_{ref}$ can be derived. If the comparator 21 is a frequency comparator, this comparator supplies an output signal which corresponds to the frequency difference between the frequencies applied to its two inputs. For a fixed $V_{ref}$ at the output of element 25, which now includes an integrator, the voltage on the output 22 of the comparator 21 should be zero and thus the frequency difference is zero.

In the case that the comparator 21 is a phase comparator, this comparator supplies, for equal frequencies applied to its inputs, a DC voltage equal to the phase difference of the signals applied to its inputs. No integrator is needed now in the element 25.

The influence of the variation of $V_{ref}$ on the capacitor values of the capacitances, due to the spreading, has the same compensational effect on the capacitor values of the transc-filter 6 and the VCO 6', so that the required frequency characteristic of the transc-filter 6 can be obtained.

The frequency characteristic of the transc-filter 6, obtained in this way, can now be varied in the way as described above with reference to FIGS. 1, 2 and 3, by means of the control signal that is applied to the tuning signal input 8, via the control signal input 15 and the signal combination unit 28. In this embodiment, the VCO 23 is controlled so as to generate a fixed VCO oscillator frequency that equals the oscillator frequency of the oscillator 18. Without any further control signal supplied to the input 15, this realizes a transc-filter 6 having a certain fixed frequency characteristic. In addition, the control signal applied to the input 15 realizes the sliding frequency scale, which leads to a variation of the freqeucy characteristic of the transc-filter 6 as shown in FIG. 3.

Figure 5:
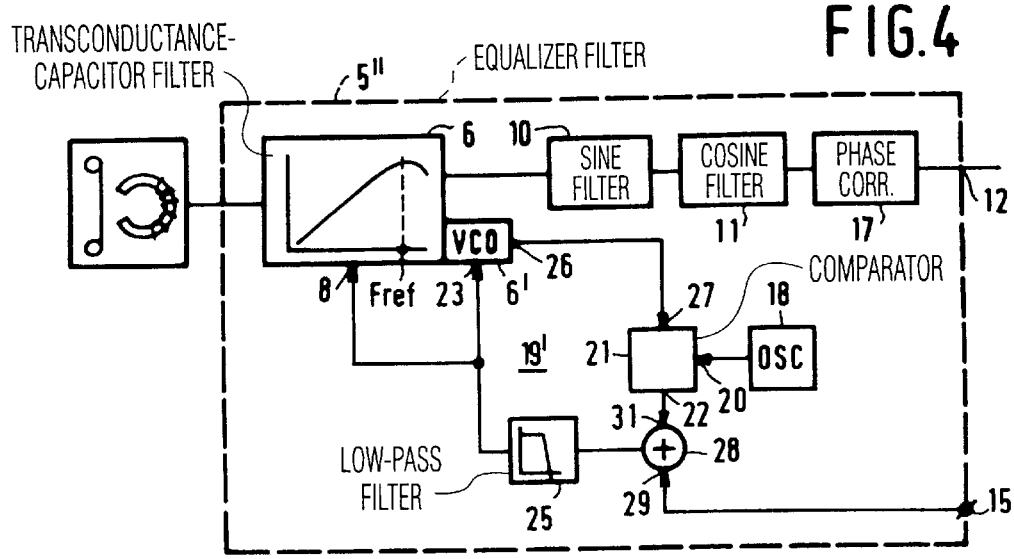
FIG. 5 shows a third embodiment, of the reproducing arrangement.

FIG. 5 shows an embodiment which is a slightly amended version of the embodiment of FIG. 4, in that the signal combination unit 28 is now included in the connection from the output 22 of the comparator 21 and the input of the loop filter 25. The comparator 21 is in this case a frequency comparator. Without any control signal applied to the input 15, the transc-filter 6 and the VCO 6' are controlled by means of the loop 19' in the same way as explained above for FIG. 4. As soon as a control signal appears at the input 15, the frequency of the VCO 6' changes so as to bring the signal present at the input of 25 back to zero. This further leads to an adaptation of the transc filter 6 to another filter curve.

Figure 6:
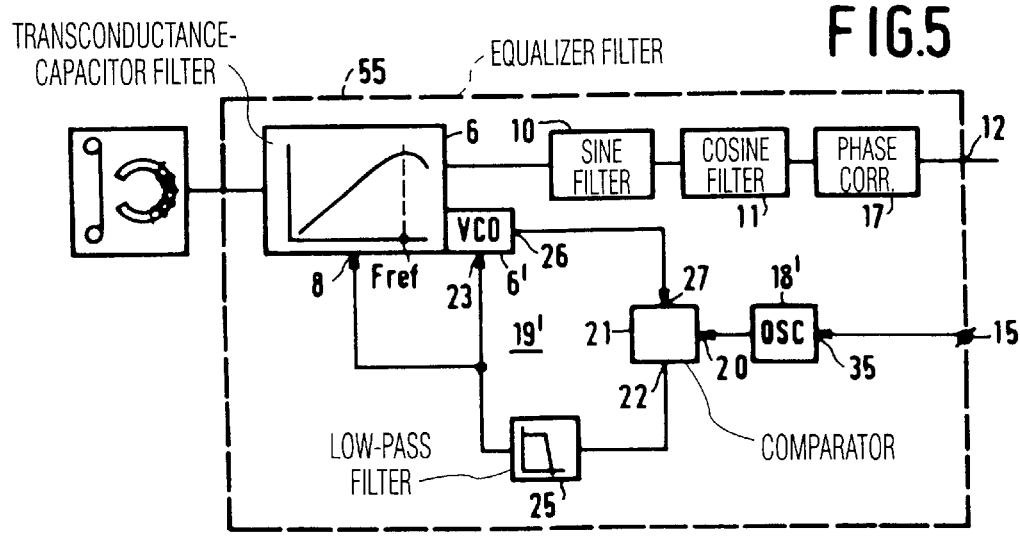
FIG. 6 shows a fourth embodiment of the reproducing arrangement.

FIG. 6 shows again another embodiment in which the signal combination unit 28 is dispensed with and the oscillator 18' is a variable oscillator having a control input 35. The control signal input 15 of the equalizer filter 55 is coupled to the control input 35 of the oscillator 18'. Without any control signal applied to the input 15, the oscillator 18' generates the same oscillator frequency as the fixed oscillator 18 of FIGS. 4 and 5. Under the influence of the control signal applied to the input 15, the oscillator frequency of the oscillator 18' varies. This leads to a varying tuning signal applied to the inputs 8 and 23 of the transc-filter 6 and the VCO 6', under the influence of which the transc-filter 6 is controlled so as to vary its frequency characteristic, and the VCO is controlled as well so as to vary its oscillator signal.

It is to be noted that the invention is not limited to the embodiments disclosed in the present figure description. The invention equally applies to those embodiments which differ from the embodiments shown in aspects which are not relevant to the invention. It should be noted that the filter characteristic of the transc-filter 6 need not be strictly exponential. Of relevance is that the filter characteristic in the frequency range below $f_{ref}$ is increasing for increasing frequencies, such as for example quadratic.

What is claimed is:

1. An arrangement for reproducing an electric signal from a track on a magnetic record carrier, the arrangement comprising:

a magnetic read head for reading an electric signal from the track, and for supplying said electric signal to an output;

variable equalizer filter means having an input coupled to an output of the magnetic read head, a control signal input and an output, the equalizer filter means equalizing the electric signal read from the track in response to a control signal supplied to the control signal input, and supplying an equalized output signal at the output of the variable equalizer filter means; and control signal generator means having an input coupled to the output of the variable equalizer filter means, and an output coupled to the control signal input of the equalizer filter means, the control signal generator means generating a control signal in response to a signal supplied to the input of the control signal generator means, and supplying the control signal to the output of the control signal generator means;

characterized in that, the variable equalizer filter means comprises:

a transconductance-capacitor filter having a tuning signal input for receiving a tuning signal, the transconductance-capacitor filter having a magnitude characteristic which increases as a function of increasing frequencies in a frequency range below a reference frequency, the control signal input of the equalizer filter means being coupled to the tuning signal input of the transconductance-capacitor filter, the transconductance-capacitor filter further controlling the reference frequency in a filter characteristic of the transconductance-capacitor filter in response to the control signal, so as to vary an angle of inclination of a filter curve in the filter characteristic below the reference frequency.

2. The arrangement as claimed in claim 1, characterized in that, the transconductance-capacitor filter exhibits a substantially exponential magnitude characteristic in the frequency range below the reference frequency.

3. The arrangement as claimed in claim 1, characterized in that, the transconductance-capacitor filter is incorporated in a chip, and the equalizer filter means further comprises:

a voltage-controlled oscillator incorporated in said chip, the voltage-controlled oscillator having a tuning signal input and an output;

a comparator having a first input coupled to the output of the voltage-controlled oscillator, and an output coupled to the tuning signal inputs of the voltage-controlled oscillator and the transconductance-capacitor filter; and oscillator means having an output coupled to a second input of the comparator, said oscillator means supplying an oscillator frequency to said second input of the comparator.

4. The arrangement as claimed in claim 3, characterized in that, the equalizer filter means further comprises a signal combination unit having a first input coupled to the control signal input of the equalizer filter means, a second input coupled to the output of the comparator, and an output coupled to the tuning signal input of the transconductance-capacitor filter.

5. The arrangement as claimed in claim 3, characterized in that, the oscillator means comprises a control signal input coupled to the control signal input of the equalizer filter means, the oscillator means supplying an oscillator frequency which varies in response to the control signal applied to the control signal input of the oscillator means.

6. The arrangement as claimed in claim 3, characterized in that, the comparator is a frequency comparator, and the equalizer filter means further comprises a signal combination unit having a first input coupled to the control signal input of the equalizer filter means, a second input coupled to the output of the comparator, and an output coupled to the tuning signal inputs of the transconductance-capacitor filter and the voltage-controlled oscillator.

7. The arrangement as claimed in claim 2, characterized in that, the transconductance-capacitor filter is incorporated in a chip, and the equalizer filter means further comprises:

a voltage-controlled oscillator incorporated in said chip, the voltage-controlled oscillator having a tuning signal input and an output;

a comparator having a first input coupled to the output of the voltage-controlled oscillator, and an output coupled to the tuning signal inputs of the voltage-controlled oscillator and the transconductance-capacitor filter; and oscillator means having an output coupled to a second input of the comparator, said oscillator means supplying an oscillator frequency to said second input of the comparator.

8. The arrangement as claimed in claim 7, characterized in that, the equalizer filter means further comprises a signal combination unit having a first input coupled to the control signal input of the equalizer filter means, a second input coupled to the output of the comparator, and an output coupled to the tuning signal input of the transconductance-capacitor filter.

9. The arrangement as claimed in claim 7, characterized in that, the oscillator means comprises a control signal input coupled to the control signal input of the equalizer filter means, the oscillator means supplying an oscillator frequency which varies in response to the control signal applied to the control signal input of the oscillator means.

10. The arrangement as claimed in claim 7, characterized in that, the comparator is a frequency comparator, and the equalizer filter means further comprises a signal combination unit having a first input coupled to the control signal input of the equalizer filter means, a second input coupled to the output of the comparator, and an output coupled to the tuning signal inputs of the transconductance-capacitor filter and the voltage-controlled oscillator.

* * * * *